(12) United States Patent
Price et al.

(10) Patent No.: US 6,351,231 B1
(45) Date of Patent: Feb. 26, 2002

(54) SUCCESSIVE APPROXIMATION ANALOGUE-TO-DIGITAL CONVERTER

(75) Inventors: Colin C. Price; Colin S. McIntosh, both of Newbury (GB)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/471,681

(22) Filed: Dec. 23, 1999

(51) Int. Cl.$^7$ .............................................. H03M 1/12
(52) U.S. Cl. ....................................... 341/155; 341/161
(58) Field of Search ................................ 341/118, 120, 341/61, 155, 143

(56) References Cited

U.S. PATENT DOCUMENTS

| | | | |
|---|---|---|---|
| 4,679,028 A | * 7/1987 | Wilson et al. | 340/347 |
| 4,777,470 A | * 10/1988 | Naylor et al. | 341/163 |
| 5,870,052 A | * 2/1999 | Dedic et al. | 341/161 |
| 6,292,125 B1 | * 9/2001 | Conroy | 341/153 |

OTHER PUBLICATIONS

Schofield, W., Dedic, I., Kemp, A, A 16 bit 500 ks/s 2.7V 5mW ADC/DAC in 0.8 μm CMOS Using Error–Correcting Successive Approximation, paper presented at the 23rd European Solid–State Circuits Conference, Sep. 1997.

* cited by examiner

Primary Examiner—Peguy JeanPierre
Assistant Examiner—Joseph Lauture
(74) Attorney, Agent, or Firm—Wolf, Greenfield & Sacks, P.C.

(57) ABSTRACT

An improved successive approximation analogue-to-digital converter system including a D/A converter and a comparison capability, wherein a first trial value is stored in a successive approximation register and a comparison is made of relative amplitude of D/A converter output with respect to analogue signal amplitude, and an iterative process is performed in which a subsequent trial value is stored in the successive approximation register before the comparison is repeated. The improvement comprises conducting only one comparison for each trial, with the subsequent trial value for a plurality of iterations being greater than one-half the first trial value, such that a first trial value determined in error is corrected during subsequent iterations. Apparatus implementing the improved successive approximation A/D is also described.

30 Claims, 8 Drawing Sheets

SUCCESSIVE APPROXIMATION ANALOGUE-TO-DIGITAL CONVERTER

FIELD OF THE INVENTION

This invention relates generally to analogue-to-digital converters (ADCs) and in particular to successive approximation analogue-to-digital converters, and is more particularly directed toward a successive approximation analogue-to-digital converter that uses continuous error correction to allow the individual bit trials to take place in a much shorter time period than that required for a conventional successive approximation ADC.

BACKGROUND OF THE INVENTION

Successive approximation ADC is the name commonly given to an analogue-to-digital conversion process in which digital approximations of the input analogue voltage are determined on the basis of a binary search. A digital value stored in an n-bit successive approximation register (SAR) is input to a digital-to-analogue converter, and a decision is made as to whether the value in the SAR represents an analogue voltage that is higher or lower than the input analogue value.

The initial value of the SAR is conventionally set to one-half the number that can be represented in the n bits of the SAR. To be more precise, an n-bit register can contain a value of $2^n-1$, but for purposes of successive approximation, the initial value has the most significant bit set and the others cleared, which translates into a value of $2^n/2$. If this comparison reveals that the digital approximation is indeed lower than the input voltage, the bit that was initially set remains set, the bit of next greater significance is also set, and another trial commences. If on the other hand, the SAR value is greater than the input analogue voltage, the bit that was set for that trial is cleared, the bit of next greater significance is set, and another trial commences. It can be appreciated from this example why a successive approximation approach bears such a similarity to a binary search procedure.

Each bit of the SAR is set or cleared based upon a trial, so the conversion process requires only "n" trials to reach completion. SAR-type algorithms achieve conversion in much less time than a ramp-up technique. A ramp-up type of conversion, for example, requires that the input register of the D/A converter "count-up" by increments of 1 until the analogue value is reached. Since each increment of the input register requires a trial to determine whether the analogue input level has been reached, many trials may have to be performed before a successful conversion is achieved. There are other types of conversion systems that are even faster than SAR ADC, such as pipeline, flash, and half-flash, but these techniques require much more power than the SAR approach, and are thus unsuitable in many applications.

The main difficulty in A/D conversion generally is settling time. The digital value that is written to the input register (the SAR register in a successive approximation system) produces an analogue output at the D/A converter which must be allowed to settle completely before a comparison is performed in order to guarantee system accuracy.

Since the practice of limiting settling times in order to speed up conversion can lead to errors, the addition of an algorithm that can correct at least some mistakes is an important improvement.

Accordingly, a need arises for a successive approximation ADC that affords the opportunity to correct errors while still operating at a higher speed than conventional SAR ADCs. The successive approximation ADC should provide enhanced capabilities without undue added complexity, cost, or power consumption.

SUMMARY OF THE INVENTION

These shortcomings of the prior art, and others, are addressed by the successive approximation ADC of the present invention. As the name suggests, an error correcting SA-ADC allows correction, later in the conversion, of errors made during prior bit-trial comparisons, provided the errors are below a certain size. The ability to correct for errors later on requires the total code correction achievable during subsequent bit trials to be greater than the code change due to the bit-weight at the location of the error, plus the error that exists to cause the incorrect decision.

The penalty for being able to correct for errors is an increased amount of digital circuitry and more comparator decisions to allow for redundancy. The increased digital circuitry is not generally a problem on today's fine-line technologies, although higher digital cross-talk and noise levels will be apparent in a tightly-packed, complex geometry. The algorithm of the invention typically requires about a 30 to 40 percent increase in the number of trials performed, but the increase could be 200 percent or more under certain circumstances. Of course, these additional trials may be performed at a very much faster rate with the inventive algorithm. Another advantage of the algorithm of the invention is that increasing the resolution of the converter does not require each bit trial to have a longer settling time, only more bit trials.

In accordance with one embodiment of the invention, an improved successive approximation analogue-to-digital converter system is provided. The system includes a D/A converter and a comparison capability, wherein a first trial value is stored in a successive approximation register and a comparison is made of relative amplitude of D/A converter output with respect to analogue signal amplitude, and an iterative process is performed in which a subsequent trial value is stored in the successive approximation register before the comparison is repeated. The improvement comprises conducting only one comparison for each trial, with the subsequent trial value for a plurality of iterations being greater than one-half the first trial value, such that a first trial value determined in error is corrected during subsequent iterations.

For at least one iteration, the subsequent trial value is equal to one-half the first trial value, and, for at least one iteration, the subsequent trial value is equal to the first trial value. The subsequent trial value may be obtained from a table of subsequent trial values, and the table may be so arranged that each subsequent trial value entry is stored with an associated iteration number. In one form of the invention, the subsequent trial value is approximately 62% of the first trial value.

In accordance with another aspect of the invention, an analogue-to-digital conversion system is provided that includes a D/A converter and a comparison capability, and a successive approximation register to which a code value is written, the successive approximation register coupled to an input of the digital-to-analogue converter. A method is provided for determining a digital representation of an analogue input signal, the method comprising the steps of storing an initial code value in the successive approximation register to provide a stored code value, waiting a predetermined time interval for the digital-to-analogue converter output to settle in response to the stored code value, and comparing the analogue input signal to the digital-to-analogue converter output to provide a comparison indication. The stored code value is corrected in accordance with the comparison indication, and the process is repeated until a predetermined number of trials have been completed. The next trial weight value is greater than one-half the stored code value, such that a stored code value determined in error is corrected during subsequent trials. The step of correcting the stored code value may comprise adding a next trial weight to the stored code value, or it may comprise subtracting a next trial weight from the stored code value.

In accordance with still another aspect of the invention, the step of storing an initial code value in the successive approximation register further comprises the steps of retrieving a predetermined initial code value from a memory storage location, and storing the predetermined initial code value in the successive approximation register.

In one form of the invention, the step of storing an initial code value in the successive approximation register further comprises the steps of computing an initial code value based, at least in part, upon number of bits in the successive approximation register, and storing the computed initial code value in the successive approximation register. In one form of the invention, the first code value is equal to $2^{n-1}$, where n is the number of bits in the successive approximation register.

In yet another aspect of the invention, an integer value corresponding to current trial number is stored in a memory storage location, and the step of waiting a predetermined time interval comprises determining the time interval based, at least in part, upon the current trial number. The step of correcting the stored code value may further include the steps of retrieving a next trial weight value from a table stored in memory, and adding the next trial weight value to the stored code value or subtracting the next trial weight value from the stored code value. Preferably, the next trial weight value is stored in the memory table in association with the current trial number.

In still another form of the invention, the step of correcting the stored code value further comprises the steps of computing the next trial weight based upon the stored code value, and either adding the computed next trial weight value to the stored code value or subtracting the next trial weight value from the stored code value.

In another aspect of the present invention, an analogue-to-digital converter comprises digital-to-analogue converter means, successive approximation register means coupled to the input of the digital-to-analogue converter means, means for storing an initial code value in the successive approximation register means to provide a stored code value, means for waiting a predetermined time interval for the digital-to-analogue converter means output to settle in response to the stored code value, means for comparing an analogue input signal to the digital-to-analogue converter means output to provide a comparison indication, and means for correcting the stored code value in accordance with the comparison indication, wherein only a single comparison is made for each trial, and the next trial weight value is greater than one-half the stored code value, such that a stored code value determined in error is corrected during subsequent trials.

In one form of the invention, the means for correcting the stored code value comprises means for adding the next trial weight value to the stored code value, or means for subtracting the next trial weight value from the stored code value.

In accordance with another form of the invention, the means for storing an initial code value in the successive approximation register means further comprises means for retrieving a predetermined initial code value from a memory means, and means for storing the predetermined initial code value in the successive approximation register means.

The means for storing an initial code value in the successive approximation register means may further comprise means for computing an initial code value based, at least in part, upon number of bits in the successive approximation register means, and means for storing the computed initial code value in the successive approximation register means. In one form of the invention, the first code value is equal to $2^{n-1}$, where n is the number of bits in the successive approximation register means.

In another form of the invention, an integer value corresponding to current trial number is stored in a memory means, and the means for waiting a predetermined time interval comprises determining the time interval based, at least in part, upon the current trial number. The means for correcting the stored code value may comprise means for retrieving a next trial weight value from a table stored in the memory means, and means for adding the next trial weight value to the stored code value, or means for subtracting the next trial weight value from the stored code value. Preferably, the next trial weight value is stored in a memory table in association with the current trial number.

In still a further aspect of the invention, the means for correcting the stored code value further comprises means for computing the next trial weight based upon the stored code value, and means for adding the computed next trial weight value to the stored code value, or means for subtracting the next trial weight value from the stored code value.

Further objects, features, and advantages of the present invention will become apparent from the following description and drawings.

BRIEF DESCRIPTION OF THE DRAWINGS

FIG. 2b shows an alternative input arrangement for the SA-ADC of FIG. 2a;

FIG. 3 is a flow chart illustrating the operation of the SA-ADC of FIG. 2a;

DETAILED DESCRIPTION OF THE INVENTION

In accordance with the present invention, a successive approximation analogue-to-digital converter is described that provides distinct advantages when compared to those of the prior art.

Figure 1:
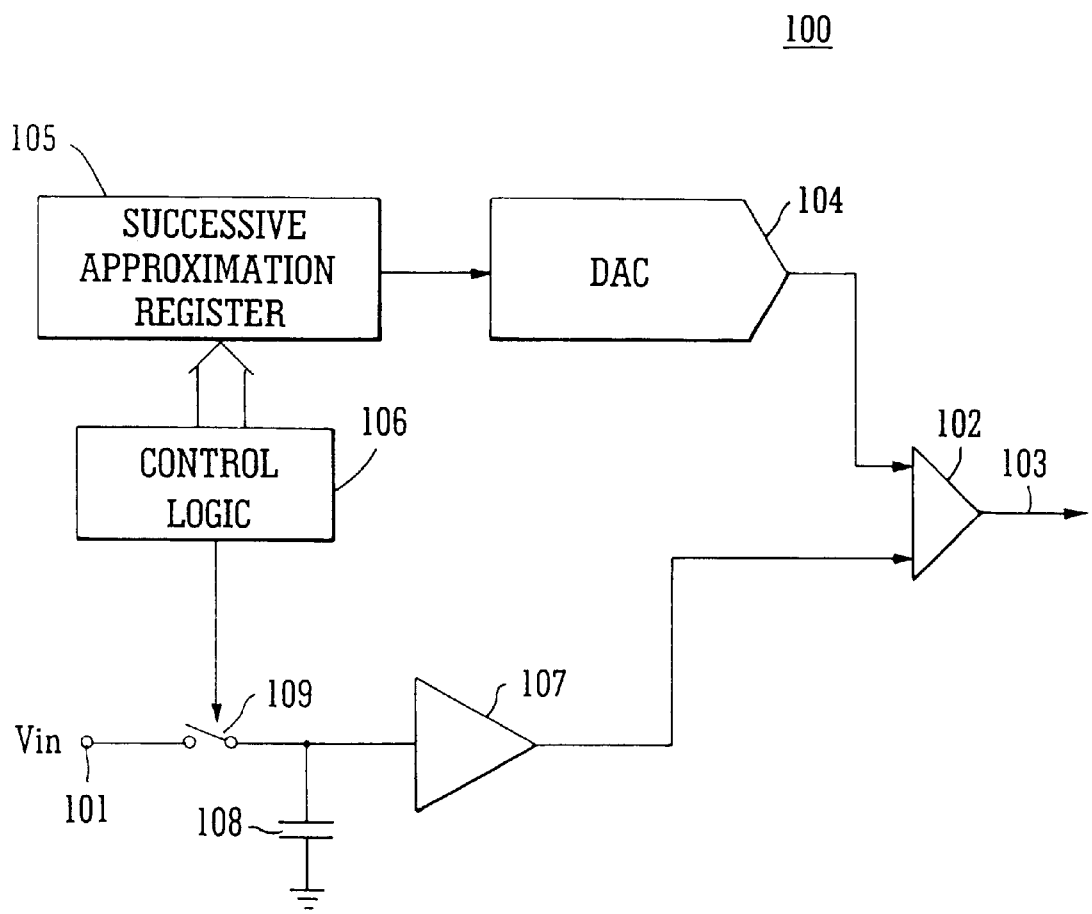
FIG. 1 illustrates a successive approximation analogue-to-digital converter of the prior art.

A conventional successive approximation analogue-to-digital converter of the prior art is illustrated in FIG. 1 and generally depicted by the numeral 100. A successive approximation register 105, which is "n" bits wide, and loaded by control logic 106, is coupled to the input register of an n-bit digital-to-analogue converter (DAC) 104. The DAC output, in turn, is coupled to one of the inputs of a comparator 102. The analogue input voltage to be measured, $V_{IN}$ 101, is coupled through a switch 109 to a sample and hold amplifier 107. A switch 109 is interposed between the analogue input signal 101 and the input of the amplifier 107. A track/hold control signal from the control logic 106 controls the state of the switch 109.

When the switch 109 is ON, the input signal 101 is allowed to reach the input of the amplifier 107, with a capacitor 108 to ground. In this mode, the capacitor 108 is allowed to charge to the level of the input signal 101. Thus, this configuration represents the TRACK mode of operation of the circuit.

When the switch 109 is OFF, on the other hand, the input signal path to the amplifier 107 is interrupted, and the voltage on the holding capacitor 108 is applied to the amplifier. This condition corresponds to the HOLD mode of operation. The logic state of the output 103 of the comparator 102 indicates the relative amplitude of the DAC output voltage with respect to the input analogue voltage.

A conventional SAR A/D 100 "finds" the value of the analogue input signal 101 using a technique that is very similar to a binary search. Initially, the comparison value provided to the SAR 105 has only the most significant bit set and the remaining bits cleared. The analogue input voltage 101 is either less than or greater than the comparison value derived from the SAR contents, in this initial case half of the voltage range. For each subsequent trial, less significant bits in the SAR are set and the comparison trials are repeated, but the "windows" of comparison always correspond to the voltage range between zero volts and the comparison level (a binary weighted fraction of the full scale voltage), and between the comparison level and the full scale voltage.

One of the disadvantages of the binary weighted voltage search algorithm associated with conventional successive approximation techniques is that, if an error happened to occur on a given trial, there is no provision for error correction. In other words, a bit set or cleared in error in the SAR always remains set or cleared, and that error persists through the end of the conversion.

Figure 2A:
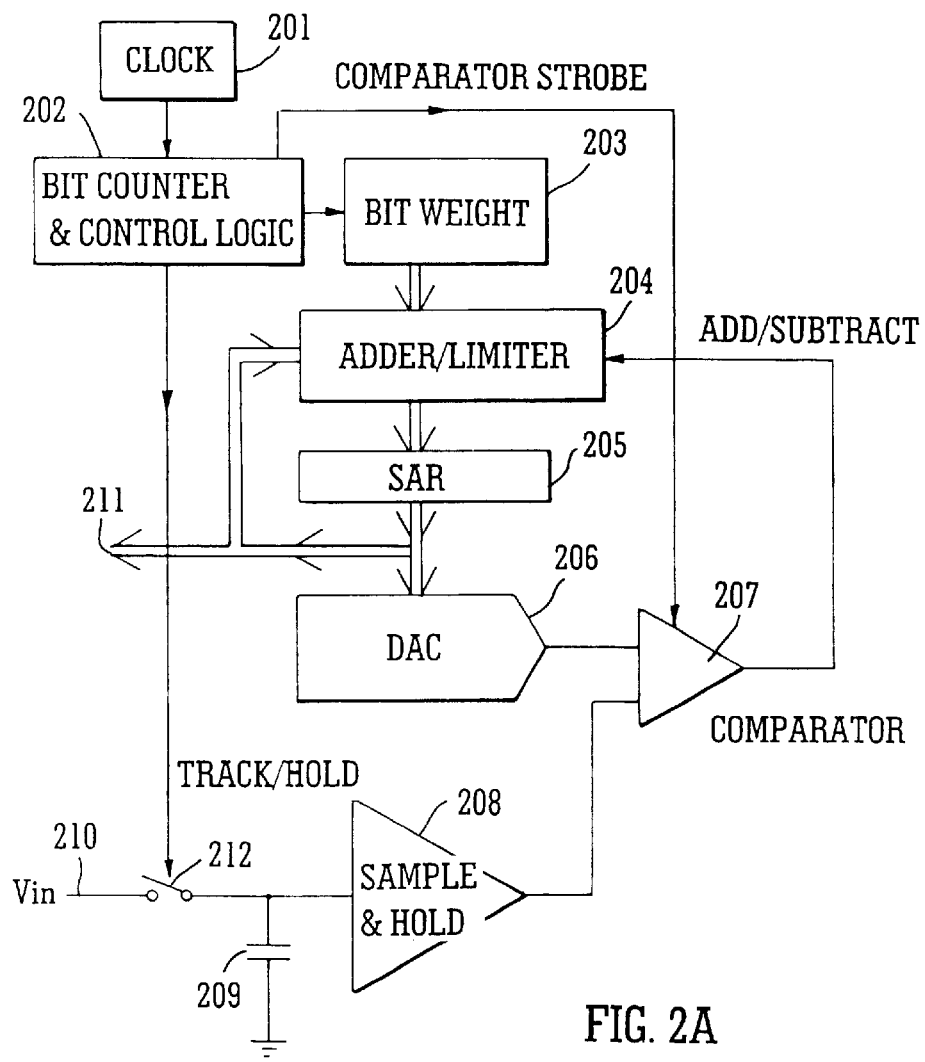
FIG. 2a is a block diagram of an improved SA-ADC in accordance with the present invention.

The system of the present invention permits continuous correction of errors, and this capability allows conversion times to be decreased such that the resulting algorithm is substantially faster than conventional SAR A/D without a great deal of added complexity. In the above type of SA (successive approximation) converter, the DAC has to be allowed to settle out to the full converter accuracy ($½^n$) for each bit trial. In practice, this corresponds to 10 time constants (10T) for a 12-bit converter and 12.5 time constants (12.5T) for a 16-bit converter, to give 0.25 LSB differential non-linearity (DNL). It is necessary to let the DAC settle out to the required accuracy for each bit trial, as any error made cannot be corrected during subsequent bit trials FIG. 2a is a block diagram of an SA ADC (generally depicted by the numeral 200) in accordance with the present invention. In addition to the SAR 205, D/A converter 206, clock 201 that provides a master clock signal to the control logic 202, comparator 207, sample & hold amplifier 208, and holding capacitor 209 that would be found in any successive approximation A/D of the prior art, the inventive system further includes a bit counter 202, bit weight unit 203, and adder/limiter 204.

Figure 2B:
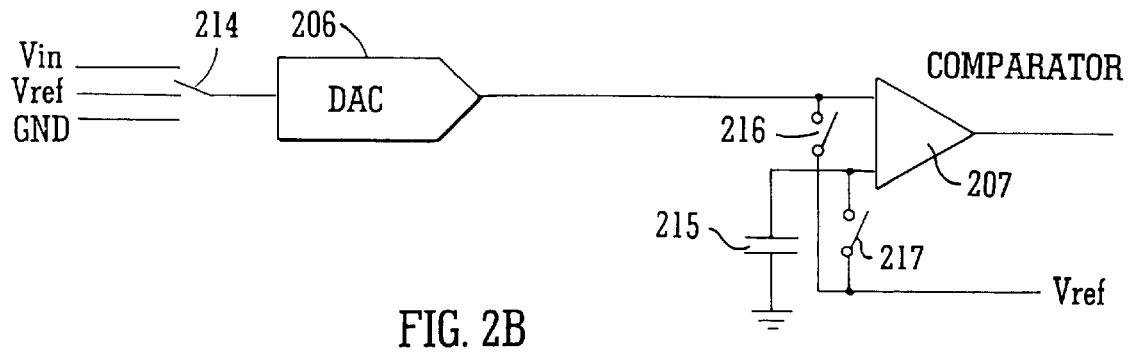

An alternative input connection is illustrated in FIG. 2b. As is known in the art, a separate sample-and-hold network is not necessarily required in ADC implementations. FIG. 2b shows the input voltage VIN coupled through a switch 214 that permits the input voltage, a reference voltage $V_{REF}$, or ground (GND) to be applied to the DAC 206 during the acquisition and conversion process. Both inputs of the comparator 207 can be coupled to the reference voltage $V_{REF}$ through switches 216, 217. The other input of the comparator 207 is coupled to ground through a capacitor 215.

The inventive system is preferably only weighted in a binary sense for the first few trials, then reverts to a system where the "weight" of a subsequent sample as compared to the current sample is determined via table look-up. Of course, as an alternative to a look-up table, the weighting factor for the next trial could also be calculated based upon an appropriate algorithm that provides weighting factors conducive to correction of errors in subsequent trials.

For purposes of discussion, the term "first trial value" is used to refer to a first one of a sequence of trial values written to the successive approximation register, and not necessarily the initial trial value used as the system performs its first comparison. The term "subsequent trial value" is simply used to denote the next trial value used in the iteration after the first trial value has been utilised. For example, the "first trial value" may be the value in the successive approximation register at the start of iteration number 5, and, after a comparison operation, the "subsequent trial value" is the value placed in the SAR for the start of iteration number 6.

Figure 3:
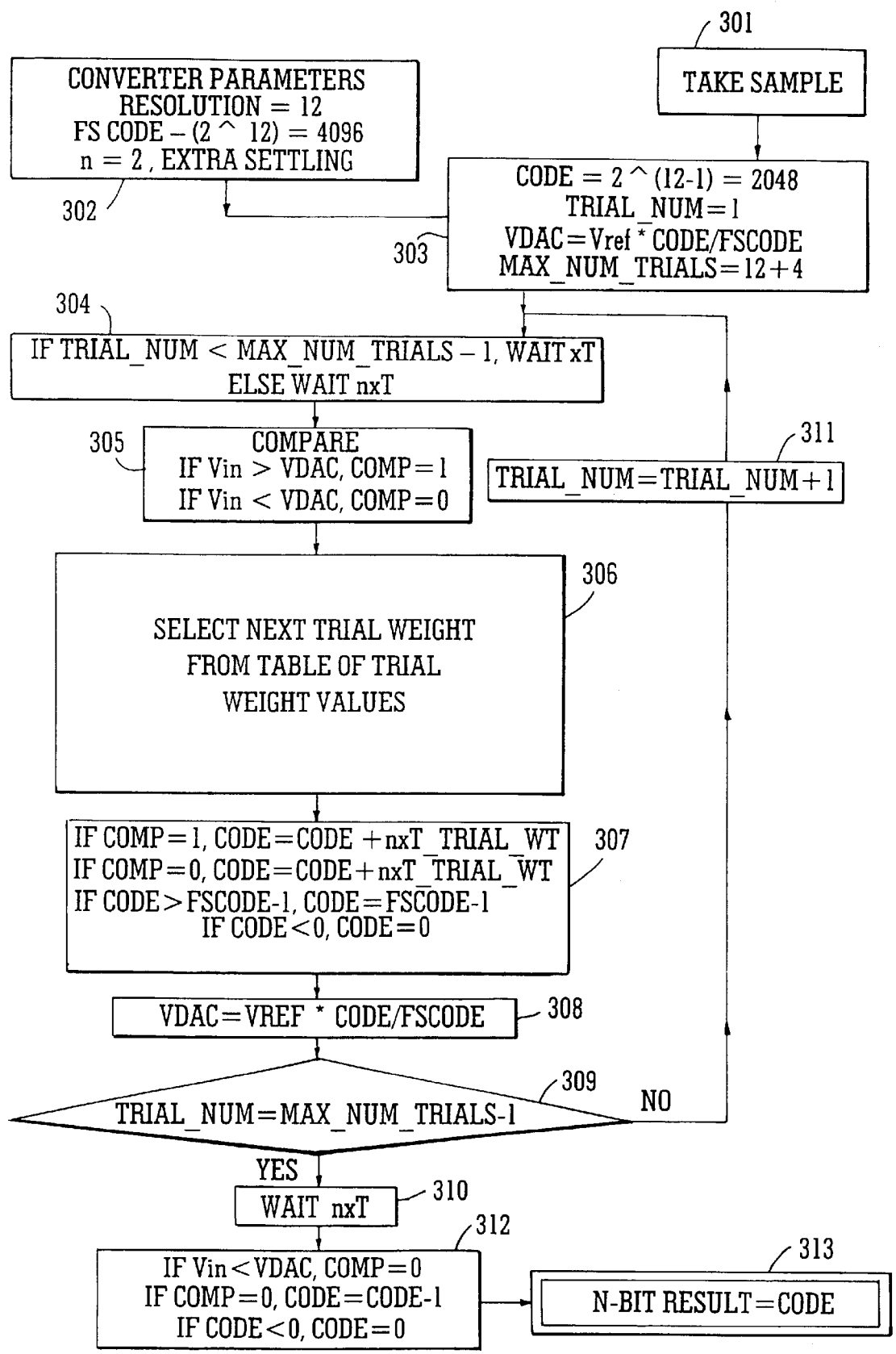

System operation can best be characterised by example. The flow chart 300 of FIG. 3 illustrates the operations performed. For a system with 12-bit resolution, the full scale value fscode is $2^{12}$, or 4096. A settling multiplier n is set to 2 to allow extra settling time under certain circumstances. These operations take place in step 302. In the subsequent operation 303, a trial number counter trial_num is set to 1, the SAR register is programmed with an initial code value "code" of fscode/2 or 2048, and a maximum number of trials control parameter is set at 12+4 or 16. The code value, once written to the D/A, yields a D/A output value of Vref (the D/A reference voltage) multiplied by the ratio of the code value to the full scale value.

The analogue input signal is then sampled (step 301). If the trial number counter trial_num is less than max_num_trials−1, then we wait for one settling interval T (step 304). If the process has reached the last two trials, we introduce an extra settling interval at this point. The standard comparison is then performed (step 305) to determine whether the analogue input voltage $V_{in}$ is less than or greater than VDAC. If Vin>VDAC, the comparator output (comp) will be 1, while if Vin<VDAC, then comp=0.

The proper weight for the next trial is then selected from the table of trial weights in step 306. As noted previously, this operation could be replaced by computation of next trial weight based upon an algorithm that yields satisfactory weight values for error correction purposes.

Preferably, the trial weights (nxt_trial_wt) are indexed by trial number (trial_num) in the table, as illustrated in Table I below:

TABLE I

| Trial Number | Next Trial Weight |
|---|---|
| 1 | 1024 |
| 2 | 512 |
| 3 | 288 |
| 4 | 178 |
| 5 | 110 |
| 6 | 68 |
| 7 | 42 |
| 8 | 26 |
| 9 | 16 |
| 10 | 10 |
| 11 | 6 |
| 12 | 4 |
| 13 | 2 |
| 14 | 1 |
| 15 | 1 |

At trial number 3, binary weighting is abandoned in the example, and the next trial weight is selected to be 288 rather than 256. This is a somewhat arbitrary transitional value, and there are certainly other values that would work just as well for this particular trial. Subsequent next trial weight values are chosen to be about 62% of the previous value. This particular weighting factor results in a distribution of subsequent trial weight values in which a given trial weight is equal to the sum of the next two subsequent trial weights. This "overlap" in output voltage range allows an error to be corrected in subsequent trials.

Of course, determination of trial weight as 62% of the prior trial weight results in only one possible implementation of an algorithm that permits error correction to occur in subsequent trials. The 62% weighting is preferable, but other weighting factors may also yield satisfactory results.

The algorithm described will function at the extremes of the relevant range. By way of example, the divisor in any trial can vary between 1 and 2. The closer the divisor value is to 1, the more range of possible error correction is achieved, but many trials may be needed to reach it. The closer the divisor is to 2, the smaller the range of correction will be, but fewer bit trials will be required under those circumstances.

If a divisor identically equal to 1 were chosen, the value for a given iteration would be the same as that in the prior iteration, and the DAC system would be unable to converge to a solution. For a divisor of 2, the trial weight is simply halved each time, resulting in the binary search algorithm known in the art. The binary search is the technique that arrives at a solution in the minimum number of trials.

If comp=1 as a result of the last trial (step 307), the new code is set to the last value of code+nxt_trial_wt. This corresponds to the situation where $V_{in}$ was determined to be greater than the DAC output voltage VDAC. If, on the other hand, comp=0 ($V_{in}$ was less than VDAC), the next code value is set to the last value of the code−nxt_trial_weight. This addition or subtraction of the next trial weight value can be considered a correction of the stored code value in accordance with the comparison indication. If the code is greater than the full scale code less 1, the code is set to that value. If the code value is less than zero, it is set equal to zero.

Once the code value has been written to the SAR, the DAC output voltage will once again become $V_{ref}$ times code/fscode in step 308. In the subsequent operation 309, the current trial number num_trial is compared to max_num_trials−1, and if it is not yet equal, an appropriate settling time is selected (step 304) and the comparison step is repeated (step 305). If we are in fact approaching the end, an extra settling time is inserted in step 310 and a comparison is made in the subsequent operation 312. If Vin<VDAC, comp=0, if comp=0, code=code−1, and if code<0, code is set equal to zero (step 312). The value of code is then the n-bit result that we are looking for (step 313).

Of course, if the trial weights are larger than conventional binary weights, the SAR will require more trials to converge on the input voltage value. But, since the algorithm is tolerant of errors, each conversion cycle can be reduced by a significant amount. Consequently, even though more comparisons must be performed, the algorithm described is significantly faster than the successive approximation A/Ds of the prior art.

In terms of settling times, the process starts by setting the MSB. This sets the DAC to mid-scale. After a period of time, which need only be 2.0T (2.0 time constants of circuit), the comparator decides if the DAC voltage is above or below the $V_{in}$ voltage. If the DAC voltage is higher, then the value stored in the register controlling the DAC (SAR) is reduced by ½ of the bit weight of the MSB. If the DAC voltage is below the $V_{in}$ voltage, then the value in the register (SAR) is increased by ½ of the bit weight of the MSB. This is exactly what happens in a traditional SAR ADC. For an n-bit DAC, the MSB value is $2^{n-1}$.

After another 2.0T, the comparator makes its second decision (MSB-1 bit trial). If the DAC at this point is higher than $V_{in}$, then a value which is equal to ½ the previous bit-weight is subtracted from the value in the SAR. Alternatively, if the comparator decides that the DAC voltage is too low, then a value which is equal to ½ the previous bit-weight is added to the value in the SAR. This is the same procedure and weighting as in a traditional SAR ADC.

After another 2.0T, the comparator makes its third decision (MSB-2 bit trial). If the DAC at this point is higher than $V_{in}$, then a value which is equal to the previous trial-weight divided by less than 2 is subtracted from the value in the SAR. Alternatively, if the comparator decides that the DAC voltage is too low, then a value which is equal to the previous trial-weight divided by less than 2 is added to the value in the SAR.

The trials continue with each trial being the same percentage (e.g., substantially 62% in a preferred embodiment) of the previous bit trial. This differs from a traditional SAR conversion where each bit trial weight is 50% of the previous bit trial. The last few bit trials are done in a binary weighted fashion due to the discrete nature of the DAC. A possible bit trial weight sequence for a 12 bit converter is:

2048 1024 512 288 178 110 68 42 26 16 10 6 4 2 1 1

As noted previously, apart from the first three MSBs and the last four LSBs, each bit trial weight is the sum of the two immediately lower bit trials. In practice, this means that any comparator decision that is in error can be corrected in the next two bit trials. The values shown above are only examples of the values that can be used with the algorithm of the invention. They are not intended to limit the scope of application of the invention. Similarly, the examples given refer to a 12-bit ADC, but the algorithm is generally applicable to an ADC of any resolution.

Performance of the algorithm according to the invention may be further improved by allowing the last two comparisons extra time to settle. Whereas all other comparisons happen after the same amount of time, for example 2.0T, this last comparisons may be given longer to settle, for example 2*2.0T. It should be noted that the last two iterations not only have an extended time to settle, but are also performed with the same weight. In the preferred embodiment, this weight is equal to 1, the minimum weight.

Figure 4:
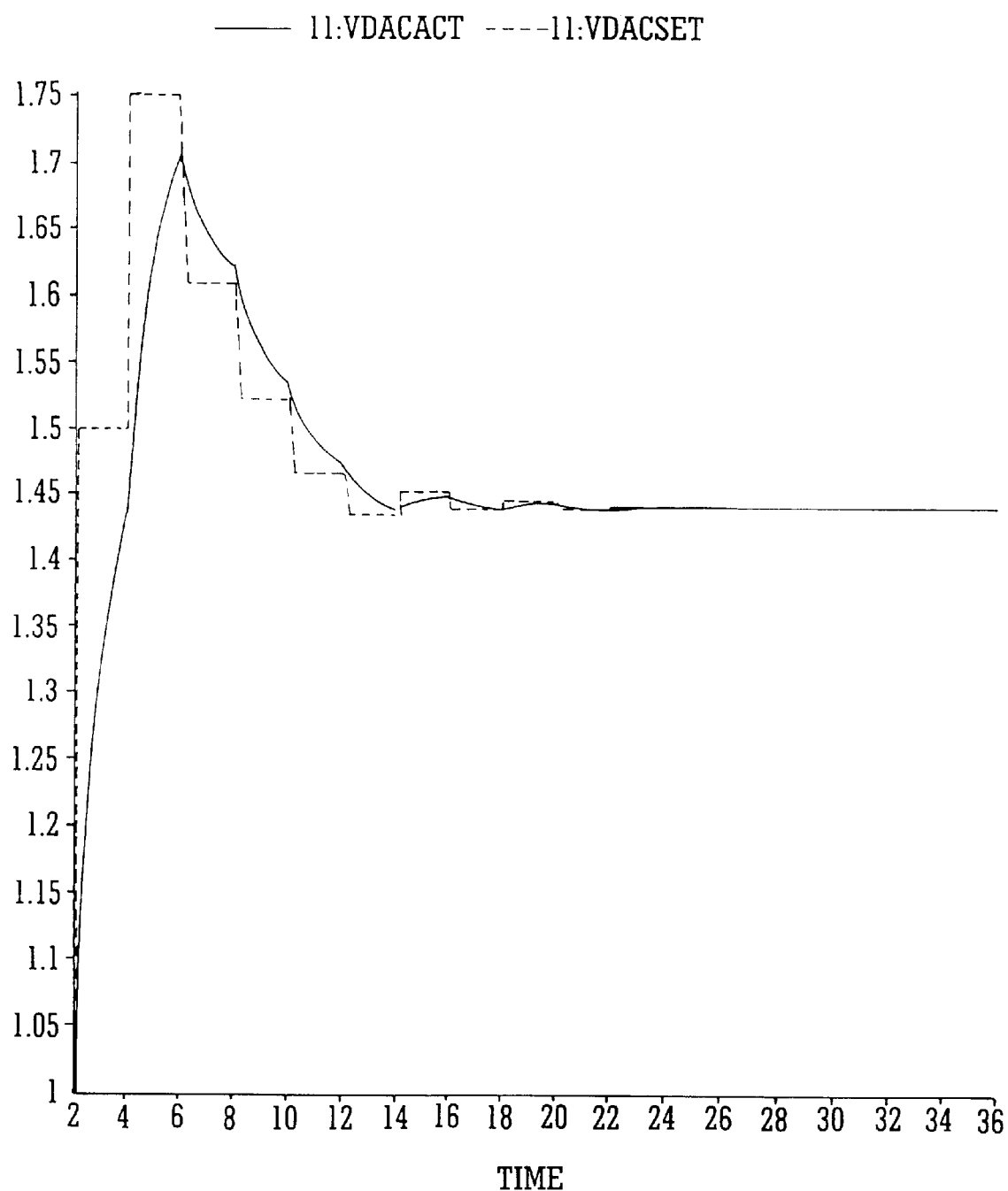
FIG. 4 is a graphical representation of the relationship between SAR value and DAC output voltage illustrating needed correction capability based upon settling error and value of the bit set in error.

FIG. 4 is a graphical representation of the relationship between SAR value and DAC output voltage illustrating needed correction capability based upon settling error and value of the bit set in error. The input voltage applied to the ADC system is 1.45 volts.

In the representation of FIG. 4, the dashed line illustrates the value to which the DAC is set, while the solid line reflects the actual DAC output voltage. The discrepancy between the two can be seen more easily in FIG. 5, which is an expanded view of the first 13 time units shown in FIG. 4. It will be noted from an examination of FIG. 5 that the initial DAC setting is 1.5 volts. The representation in FIG. 5 actually begins with the second bit trial (the amplitude scale has its origin at 1.0 volt and the time scale begins at time=2.0 units). This represents three-fourths of the full-scale measurement range of 2 volts, the appropriate setting for the second bit trial. The first bit trial, which is not depicted, was conducted with the DAC set at 1.0 volt, or one-half of the full-scale measurement range of the system.

Figure 5:
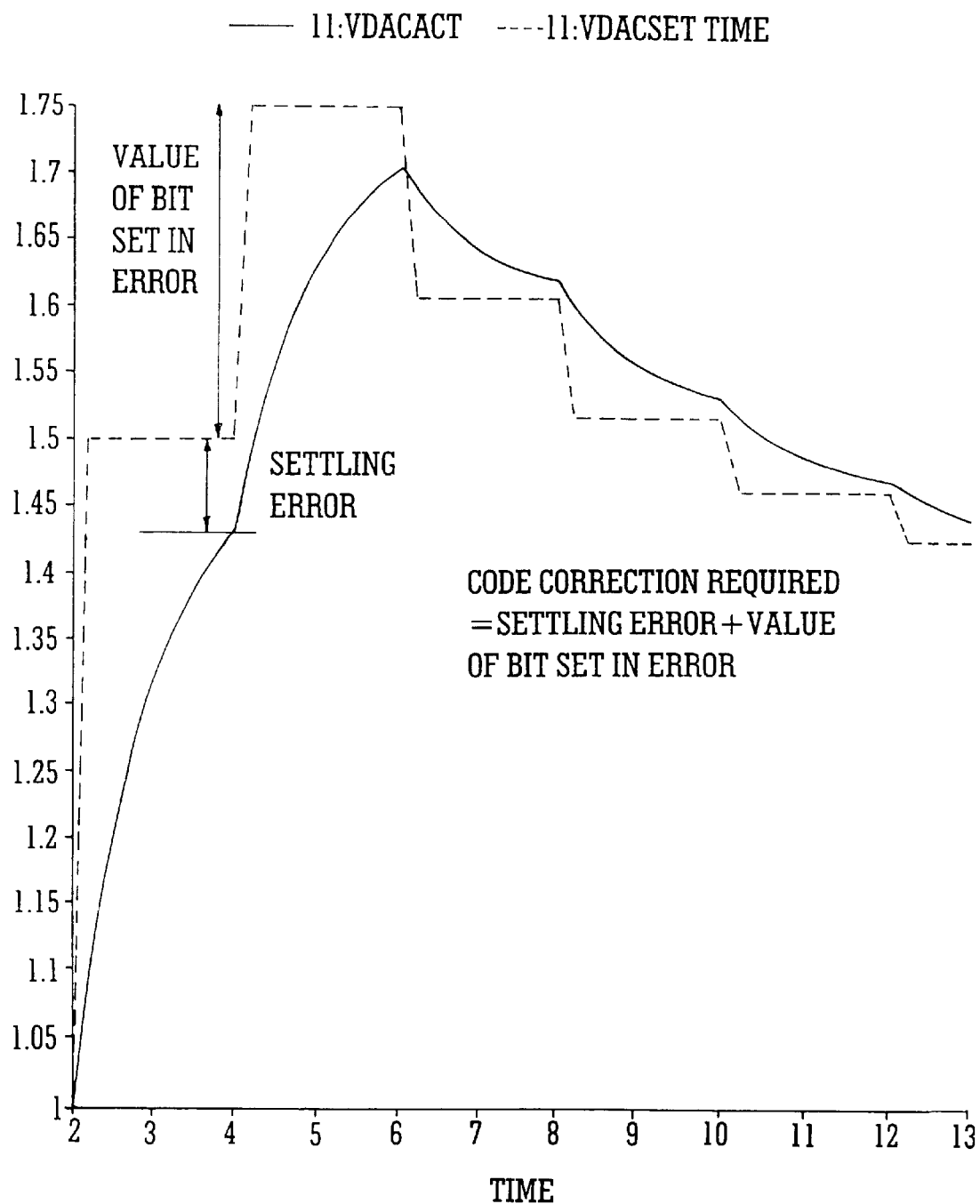
FIG. 5 is an expanded view of a portion of FIG. 4.

The actual DAC output voltage is not permitted to reach the set point, however, so the ADC system incorrectly decides that the input voltage is greater than 1.5 volts. This is incorrect, of course, because the input voltage in this example is 1.45 volts. The error is induced because the settling time allowed is insufficient. As shown in FIG. 5, the code correction required is equal to the settling error plus the value of the bit set in error. Using the algorithm and ADC system in accordance with the invention, the initial error is corrected in subsequent trials as the DAC output voltage converges to the input voltage of 1.45 volts.

Figure 6:
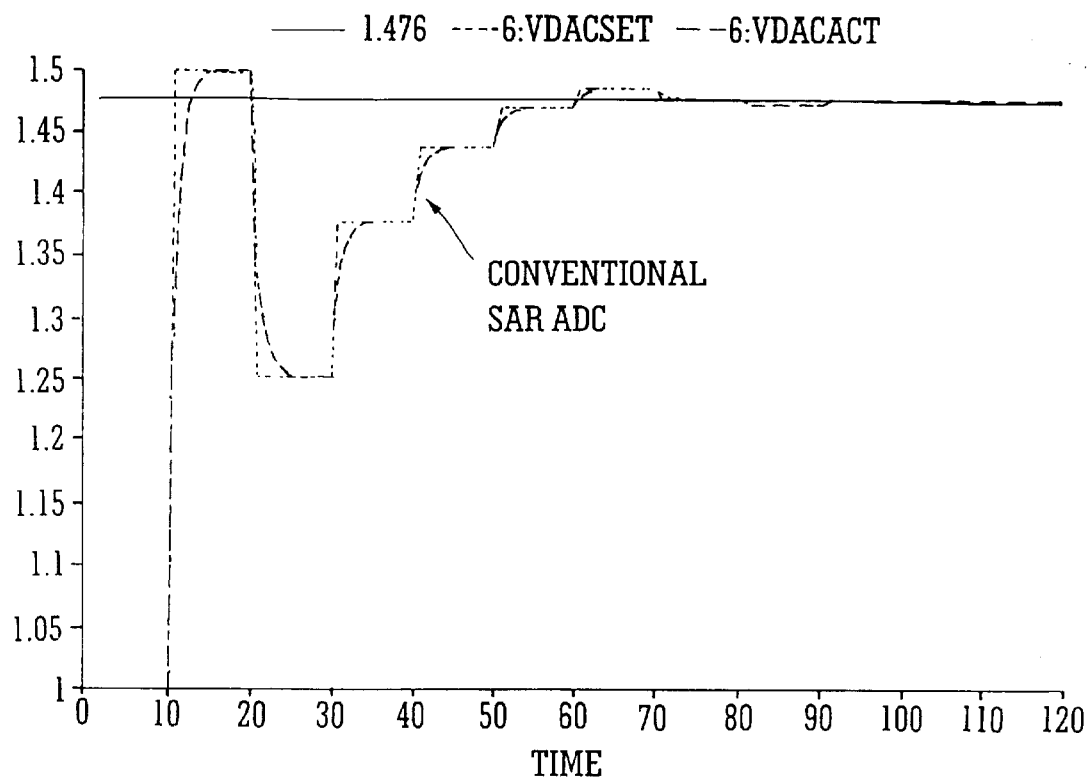
FIG. 6 is a timing diagram illustrating the time required for a conventional SAR DAC to reach an accurate result.
Figure 7:
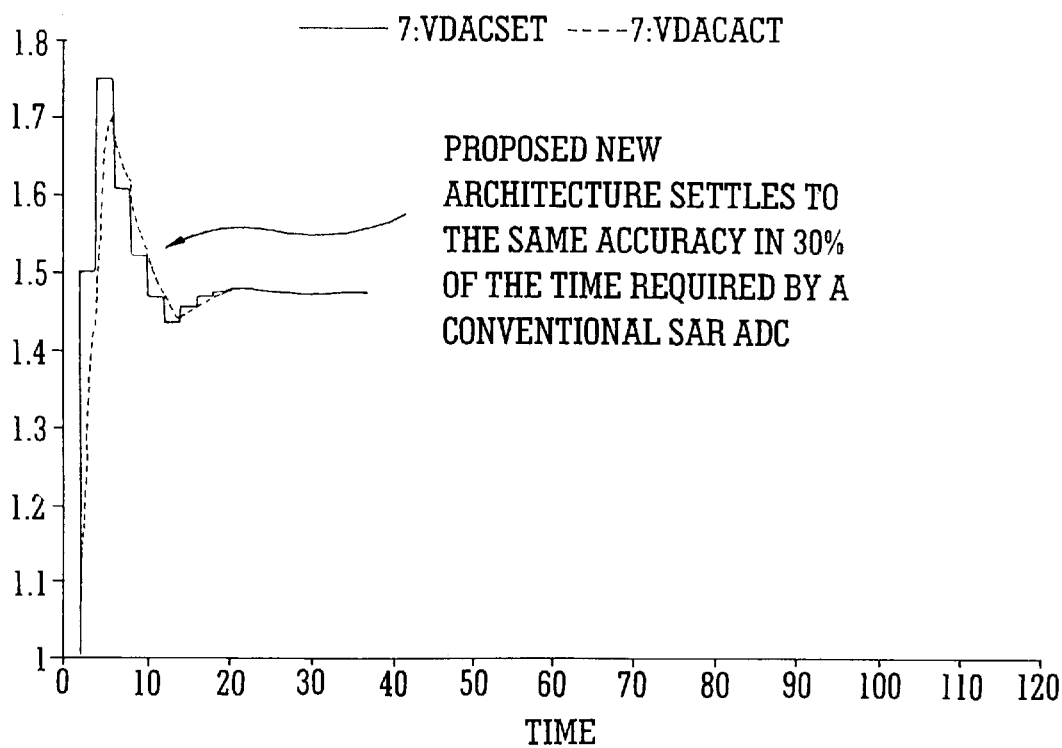
FIG. 7 is a timing diagram, using the same time scale as that of FIG. 6, showing the time required for an SAR ADC in accordance with the present invention to reach an accurate result.

FIG. 6 offers a view of the operation of a conventional SAR ADC system. In order for the system to settle to an accurate determination of the input voltage, approximately 120 time units are required, as shown in the figure. In contrast, FIG. 7 illustrates the operation of the SAR ADC system in accordance with the present invention. Because a bit set in error can be corrected during subsequent bit trials, the ADC system in accordance with the present invention settles to the same accuracy as the system of the prior art in about 30 percent of the time required by a conventional SAR ADC.

Figure 8:
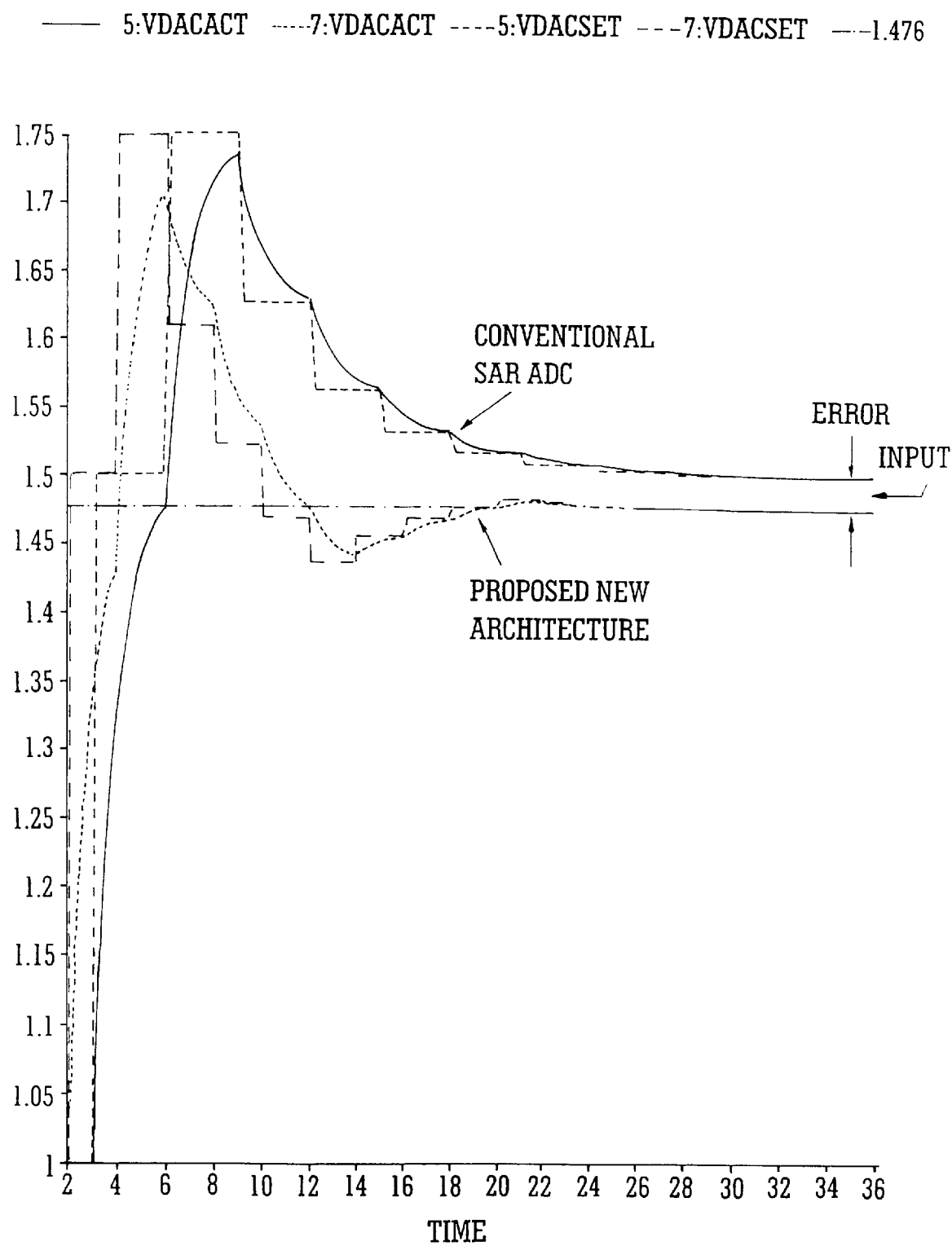
FIG. 8 is a timing diagram showing comparative performance of a conventional ADC, and the improved ADC in accordance with the present invention, under the same conversion time constraints.

The timing diagram of FIG. 8 presents a side-by-side comparison of the performance of an SAR ADC of the prior art and the improved SAR ADC of the present invention, when both systems are allocated the same time in which to complete the conversion. The diagram shows the results with an input voltage of 1.476 volts. As will be appreciated from an examination of FIG. 8, the conventional SAR ADC system erroneously determines the first bit, and is never able to recover. The result reached by the conventional system is incorrect. The improved SAR ADC of the present invention makes the same incorrect determination at the first bit trial, but is able to recover and converges to the correct result.

Figure 9:
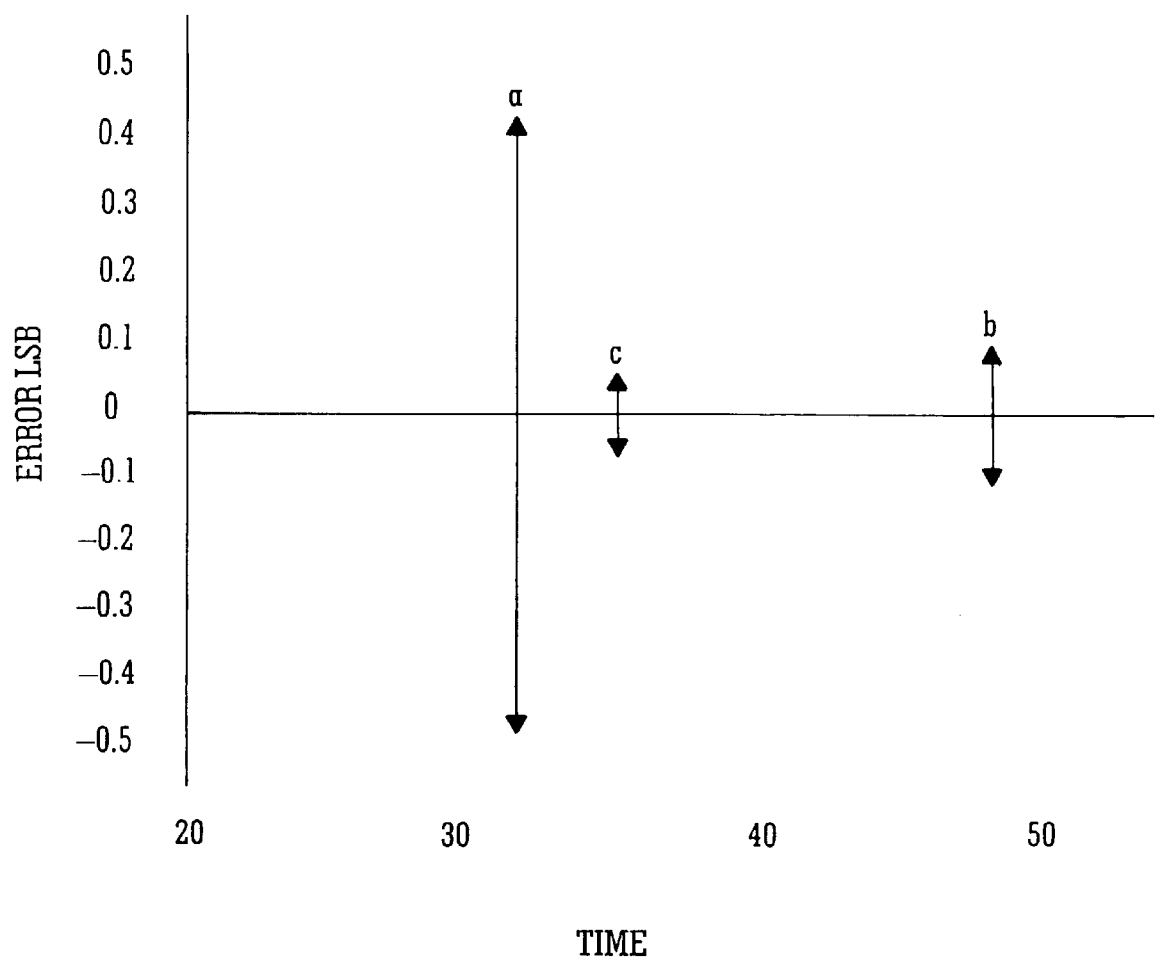
FIG. 9 depicts error versus conversion time when the last two bit-trial times are extended.

FIG. 9 illustrates the advantages that can be realised by extending the last two bit trials. The amplitude of line a indicates that maximum error occurs when a time period 2*T is allowed for each of the bit trials, including the last two bit trials. Conversion time is minimised at 32*T. The amplitude of line b indicates that error can be much reduced by allowing 3*T for each of the bit trials, including the last two, but conversion time has been increased to 48*T. The best result is obtained as shown by the amplitude of line c, where 2*T is allowed for each bit trial except the last two, which are allowed 4*T each. This extends the conversion time slightly over the first example (36*T as compared to 32*T) but the conversion accuracy is excellent.

There has been described herein a successive approximation analogue-to-digital converter which is improved over the prior art. It will be apparent to those skilled in the art that modifications may be made without departing from the spirit and scope of the invention. Accordingly, it is not intended that the invention be limited except as may be necessary in view of the appended claims.

What is claimed is:

1. In a successive approximation analog-to-digital converter system that includes a D/A converter and a comparison capability, wherein a first trial weight value is stored in a successive approximation register and a comparison is made of relative amplitude of D/A converter output with respect to analog signal amplitude, and an iterative process is performed in which a subsequent trial weight value is stored in the successive approximation register before the comparison is repeated, the improvement comprising:

only one comparison is made during each iteration; and for a plurality of iterations, the subsequent trial weight value is greater than one-half the first trial weight value of the iteration, such that a first trial weight value determined in error is corrected during subsequent iterations.

2. The improved successive approximation analog-to-digital converter system of claim 1, wherein, for at least one iteration, the subsequent trial weight value is equal to one-half the first trial weight value.

3. The improved successive approximation analog-to-digital converter system of claim 1, wherein, for at least one iteration, the subsequent trial weight value is equal to the first trial weight value.

4. The improved successive approximation analog-to-digital converter system of claim 1, wherein the subsequent trial weight value is obtained from a table of subsequent trial weight values.

5. The improved successive approximation analog-to-digital converter system of claim 4, wherein the table of subsequent trial weight values is arranged such that each subsequent trial weight value entry is stored with an associated iteration number.

6. The improved successive approximation analog-to-digital converter system of claim 1, wherein the subsequent trial weight value is approximately 62% of the first trial weight value.

7. For an analog-to-digital conversion system that includes a D/A converter and a comparison capability, and a successive approximation register to which a code value is written, the successive approximation register coupled to an input of the digital-to-analog converter, a method for determining a digital representation of an analog input signal, the method comprising:

(a) storing an initial code value in the successive approximation register to provide a stored code value;

(b) waiting a predetermined time interval for the digital-to-analog converter output to settle in response to the stored code value;

(c) comparing the analog input signal to the digital-to-analog converter output to provide a comparison indication;

(d) correcting the stored code value in accordance with the comparison indication using a trial weight value;

(e) repeating steps (b) through (d) until a predetermined number of trials have been completed;

wherein for a plurality of trials the trial weight value is greater than one half the preceding trial weight value, such that a stored code value determined in error is corrected during subsequent trials.

8. The method in accordance with claim 7, wherein the step (d) of correcting the stored code value comprises adding a next trial weight value to the stored code value.

9. The method in accordance with claim 7, wherein the step (d) of correcting the stored code value comprises subtracting a next trial weight value from the stored code value.

10. The method in accordance with claim 7, wherein the step (a) of storing an initial code value in the successive approximation register further comprises the steps of:
(a1) retrieving a predetermined initial code value from a memory storage location; and
(a2) storing the predetermined initial code value in the successive approximation register.

11. The method in accordance with claim 7, wherein the step (a) of storing an initial code value in the successive approximation register further comprises the steps of:
(a1) computing an initial code value based, at least in part, upon number of bits in the successive approximation register; and
(a2) storing the computed initial code value in the successive approximation register.

12. The method in accordance with claim 11, wherein the initial code value is equal to $2^{n-1}$, where n is the number of bits in the successive approximation register.

13. The method in accordance with claim 7, wherein an integer value corresponding to current trial number is stored in a memory storage location, and step (b) of waiting a predetermined time interval comprises determining said time interval based, at least in part, upon the current trial number.

14. The method in accordance with claim 7, wherein an integer value corresponding to current trial number is stored in a memory storage location, and the step (d) of correcting the stored code value further comprises the steps of:
(d1) retrieving a next trial weight value from a table stored in memory; and
(d2) adding the next trial weight value to the stored code value.

15. The method in accordance with claim 7, wherein an integer value corresponding to current trial number is stored in a memory storage location, and the step (d) of correcting the stored code value further comprises the steps of:
(d1) retrieving a next trial weight value from a table stored in memory; and
(d2) subtracting the next trial weight value from the stored code value.

16. The method in accordance with claim 14 or 15, wherein the next trial weight value is stored in the memory table in association with the current trial number.

17. The method in accordance with claim 7, wherein an integer value corresponding to current trial number is stored in a memory storage location, and the step (d) of correcting the stored code value further comprises the steps of:
(d1) computing the next trial weight based upon the stored code value; and
(d2) adding the computed next trial weight value to the stored code value.

18. The method in accordance with claim 7, wherein an integer value corresponding to current trial number is stored in a memory storage location, and the step (d) of correcting the stored code value further comprises the steps of:

(d1) computing the next trial weight based upon the stored code value; and
(d2) subtracting the computed next trial weight value from the stored code value.

19. An analog-to-digital converter comprising:
a digital-to-analog converter;
successive approximation register means coupled to the input of the digital-to-analog converter means;
means for storing an initial code value in the successive approximation register means to provide a stored code value;
means for waiting a predetermined time interval for the digital-to-analog converter means output to settle in response to the stored code value;
means for comparing an analog input signal to the digital-to-analog converter means output to provide a comparison indication; and
means for correcting the stored code value using a trial weight value in accordance with the comparison indication;
wherein only one comparison is made for each trial, and for a plurality of trials the next trial weight value is greater than one-half the present trial weight value, such that a trial weight value determined in error is corrected during subsequent trials.

20. The analogue-to-digital converter of claim 19, wherein the means for correcting the stored code value comprises means for adding a next trial weight value to the stored code value.

21. The analogue-to-digital converter of claim 19, wherein the means for correcting the stored code value comprises means for subtracting a next trial weight value from the stored code value.

22. The analogue-to-digital converter of claim 19, wherein the means for storing an initial code value in the successive approximation register means further comprises:
means for retrieving a predetermined initial code value from a memory means; and
means for storing the predetermined initial code value in the successive approximation register means.

23. The analogue-to-digital converter of claim 19, wherein the means for storing an initial code value in the successive approximation register means further comprises:
means for computing an initial code value based, at least in part, upon number of bits in the successive approximation register means; and
means for storing the computed initial code value in the successive approximation register means.

24. The analogue-to-digital converter of claim 23, wherein the initial code value is equal to $2^{n-1}$, where n is the number of bits in the successive approximation register means.

25. The analogue-to-digital converter of claim 19, wherein an integer value corresponding to current trial number is stored in a memory means, and the means for waiting a predetermined time interval comprises determining said time interval based, at least in part, upon the current trial number.

26. The analogue-to-digital converter of claim 19, wherein an integer value corresponding to current trial number is stored in a memory means, and the means for correcting the stored code value further comprises:
means for retrieving a next trial weight value from a table stored in the memory means; and
means for adding the next trial weight value to the stored code value.

27. The analogue-to-digital converter of claim 19, wherein an integer value corresponding to current trial number is stored in a memory means, and the means for correcting the stored code value further comprises:

means for retrieving a next trial weight value from a table stored in the memory means; and means for subtracting the next trial weight value from the stored code value.

28. The analogue-to-digital converter of claim 26 or claim 27, wherein the next trial weight value is stored in a memory table in association with the current trial number.

29. The analogue-to-digital converter of claim 19, wherein an integer value corresponding to current trial number is stored in a memory means, and the means for correcting the stored code value further comprises:

means for computing the next trial weight based upon the stored code value; and means for adding the computed next trial weight value to the stored code value.

30. The analogue-to-digital converter of claim 19, wherein an integer value corresponding to current trial number is stored in a memory means, and the means for correcting the stored code value further comprises;

means for computing the next trial weight based upon the stored code value; and means for subtracting the computed next trial weight value from the stored code value.

* * * * *